United States Patent [19]

Okino

[11] Patent Number: 4,670,879
[45] Date of Patent: Jun. 2, 1987

[54] PATTERN GENERATOR

[75] Inventor: Noboru Okino, Gyoda, Japan

[73] Assignee: Takeda Riken Kogyo Kabushikikaisha, Tokyo, Japan

[21] Appl. No.: 702,256

[22] Filed: Feb. 15, 1985

[30] Foreign Application Priority Data

Feb. 15, 1984 [JP] Japan .................................. 59-27643

[51] Int. Cl.⁴ ........................................... G06F 11/22
[52] U.S. Cl. ........................................ 371/27; 371/25
[58] Field of Search ........................... 371/27, 25, 20; 364/518, 490, 491; 324/73 R, 73 AT

[56] References Cited

U.S. PATENT DOCUMENTS

| | | | |
|---|---|---|---|
| 3,783,254 | 1/1974 | Eichelberger | 364/200 |
| 4,287,594 | 9/1981 | Shirasaka | 371/27 |
| 4,313,200 | 1/1982 | Nishiura | 371/25 |
| 4,528,634 | 7/1985 | Nakahata | 364/518 |
| 4,547,861 | 10/1985 | Laviron | 371/27 |
| 4,550,406 | 10/1985 | Neal | 371/27 |
| 4,555,663 | 11/1985 | Shimizu | 371/27 |
| 4,571,724 | 2/1986 | Belmondo | 371/27 |

Primary Examiner—Michael R. Fleming
Attorney, Agent, or Firm—Staas & Halsey

[57] ABSTRACT

In a main pattern memory are stored an increment command pattern and an enable control pattern in addition to test patterns. The main pattern memory is read out with an address from an address control circuit. The increment command pattern thus read out of the main pattern memory instructs incrementing of an address pointer, and a partial pattern memory is read out according to the contents of the address pointer. In accordance with the enable control pattern read out of the main pattern memory, a gate circuit is controlled to open, through which the output of the partial pattern memory is passed, and bits of the passed output are each ORed, by an OR circuit, with the corresponding bits of the test pattern read out of the main pattern memory, providing the ORed output as a test pattern.

8 Claims, 14 Drawing Figures

FIG. 1 PRIOR ART

| PROG CTR | 0 | | P | P+1 | | 255 | |
|---|---|---|---|---|---|---|---|
| 0 | 0 | | | | | | $a_1$ |
| 1 | 1 | | | | | | $b_1$ |
| 2 | 1 | | | | | | $b_2$ |
| 3 | 1 | | | } 1a | | | $b_3$ |
| 4 | 1 | | | | | | $b_4$ |
| 5 | 1 | | | | | | $b_5$ |
| 6 | 0 | | | | | | $a_2$ |
| 7 | 1 | | | | | | $b_6$ |
| 8 | 1 | | | | | | $b_7$ |
| 9 | 1 | | | } 1b | | | $b_8$ |
| 10 | 1 | | | | | | $b_9$ |
| 11 | 1 | | | | | | $b_{10}$ |
| 12 | 0 | | | | | | $a_3$ |
| 13 | 1 | | | | | | $b_{11}$ |
| 14 | 1 | | | | | | $b_{12}$ |
| 15 | 1 | | | } 1c | | | $b_{13}$ |
| 16 | 1 | | | | | | $b_{14}$ |
| 17 | 1 | | | | | | $b_{15}$ |
| 18 | 0 | | | | | | $a_4$ |
| 19 | 1 | | | | | | $b_{16}$ |
| 20 | 1 | | | | | | $b_{17}$ |
| 21 | 1 | | | } 1d | | | $b_{18}$ |
| 22 | 1 | | | | | | $b_{19}$ |
| 23 | 1 | | | | | | $b_{20}$ |
| | 0 | | | | | | $a_5$ |
| | 1 | | | | | | $b_{21}$ |
| | 1 | | | | | | |
| | 1 | | | | | | |

| STEP | 21 | 22 | 13a | 15a | 14a |
|---|---|---|---|---|---|
| 0 | 0 | 0 | 0 | 0 | 0 |
| 1 | 1 | — | 1 | 0 | 1 |
| 2 | 1 | — | 1 | 1 | 1 |
| 3 | 1 | — | 1 | 2 | 1 |
| 4 | 1 | — | 1 | 3 | 1 |
| 5 | 1 | — | 1 | 4 | 1 |
| 6 | 2 | — | 0 | 5 | 0 |
| 7 | 3 | — | 1 | 5 | 1 |
| 8 | 3 | — | 1 | 6 | 1 |
| 9 | 3 | — | 1 | 7 | 1 |
| 10 | 3 | — | 1 | 8 | 1 |
| 11 | 3 | — | 1 | 9 | 1 |
| 12 | 4 | — | 0 | 10 | 0 |
| 13 | 5 | — | 1 | 10 | 1 |
| 14 | 5 | — | 1 | 11 | 1 |
| 15 | 5 | — | 1 | 12 | 1 |
| 16 | 5 | — | 1 | 13 | 1 |
| 17 | 5 | — | 1 | 14 | 1 |

| STEP | 0 | P | P+n | 255 |
|---|---|---|---|---|
| 1 | $a_0$ | | | |
| 2 | $a_1$ | | | |
| 3 | $a_2$ | $d_0$ | | |
| 4 | $a_3$ | $d_1$ | | |
| 5 | $a_4$ | $d_1$ | | |
| 6 | $a_5$ | | | |
| 7 | $a_0$ | | | |
| 8 | $a_1$ | | | |
| 9 | $a_2$ | $d_2$ | | |
| 10 | $a_3$ | $d_3$ | | |
| 11 | $a_4$ | $d_3$ | | |
| 12 | $a_5$ | | | |
| 13 | $a_0$ | | | |
| 14 | $a_1$ | | | |
| 15 | $a_2$ | $d_4$ | | |
| 16 | $a_3$ | $d_5$ | | |
| 17 | $a_4$ | $d_5$ | | |
| 18 | $a_5$ | | | |

FIG. 12

| ADDRESS | 32 | 33 | 13 | 14 | 12 (P ... P+n) 34 | | |
|---|---|---|---|---|---|---|---|
| 0 | JSR | 10 | 0 | 0 | $a_0$ | | |
| 1 | JSR | 10 | 0 | 0 | $a_0$ | | |
| 2 | JSR | 10 | 0 | 0 | $a_0$ | | |
| ... | | | | | | | |
| 10 | NOP | — | 0 | 0 | $a_1$ | | |
| 11 | NOP | — | 1 | 1 | $a'_2$ | 0 | |
| 12 | NOP | — | 0 | 1 | $a'_3$ | 0 | |
| 13 | NOP | — | 1 | 1 | $a'_4$ | 0 | |
| 14 | RTN | — | 0 | 0 | $a_5$ | | |

FIG. 13

| ADDRESS POINTER | 16 |
|---|---|
| 0 | $d_0$ |
| 1 | $d_1$ |
| 2 | $d_2$ |
| 3 | $d_3$ |
| 4 | $d_4$ |
| 5 | $d_5$ |

FIG. 14

| STEP | PC(21) | 22 | 13a | 15a | 14a |
|---|---|---|---|---|---|
| 1 | 0 | 0 | 0 | 0 | 0 |
| 2 | 10 | — | 0 | 0 | 0 |
| 3 | 11 | — | 1 | 0 | 1 |
| 4 | 12 | — | 0 | 1 | 1 |
| 5 | 13 | — | 1 | 1 | 1 |
| 6 | 14 | — | 0 | 2 | 0 |
| 7 | 1 | — | 0 | 2 | 0 |
| 8 | 10 | — | 0 | 2 | 0 |
| 9 | 11 | — | 1 | 2 | 1 |
| 10 | 12 | — | 0 | 3 | 1 |
| 11 | 13 | — | 1 | 3 | 1 |
| 12 | 14 | — | 0 | 4 | 0 |
| 13 | 2 | — | 0 | 4 | 0 |
| 14 | 10 | — | 0 | 4 | 0 |
| 15 | 11 | — | 1 | 4 | 1 |
| 16 | 12 | — | 0 | 5 | 1 |
| 17 | 13 | — | 1 | 5 | 1 |
| 18 | 14 | — | 0 | 6 | 0 |

PATTERN GENERATOR

BACKGROUND OF THE INVENTION

The present invention relates to a pattern generator which is employed in testing of logic circuit devices and which generates test data for input into the logic circuit device under test (hereinafter referred to as DUT) and correct data corresponding to the output of the logic circuit device based on the input of the test data, that is, expected value data.

With an increase in the integration density and in the logic depth of the logic circuit device, which usually comprises a plurality of relatively simplestructured internal logic circuits or combinational logic circuits, it will become more and more difficult to locate failures by the common traditional method of only applying test data to input terminals of the DUT and then checking data obtained from its output terminals because many steps are involved in processing of the input data, and it will also be difficult to generate the test pattern that insures a 100% failure detection. As a solution to this problem a logic design through the LSSD techniques has been proposed, for example, in U.S. Pat. No. 3,783,254. According to the LSSD techniques, flip-flops provided for latching the outputs of respective internal logic circuits in the DUT are arranged to be directly connectable to one another all in series, in response to a control signal, and individual test patterns are serially input into the series-connected flip-flops. Then the series connection is resolved into individuals and the test data thus input are applied to the subsequent internal or combinatorial logic circuits respectively connected to the flip-flops and the operation of the internal logic circuits is advanced by one clock. The results of their operations are input again into the flip-flops and they are connected again in series, after which their states are serially read out and, at the same time, new test data are serially input into the flip-flops and the read-out data is checked to see whether the corresponding internal logic circuit operated correctly. In this manner, the entire logic circuit device is tested.

Each of the successive test patterns to be used for the logic circuit device designed by such LSSD techniques is composed of N bits of the same number as the sum of the numbers of input and output terminals of the logic circuit device. In the test pattern for advancing the operation of the internal logic circuits in parallel (i.e. simultaneously) by one step, the N bit pattern consists of input data and expected value data, but during the periods in which test data is applied to the series-connected flip-flops and operation results are read out from the series connected flip-flops, only three bits in each N-bit test pattern, that is, one-bit test data for input to one end of the series connection of the flip-flops, expected value data for comparison with one-bit data that is read out from the other end of the series connection and one-bit control data for connecting the flip-flops in series, are effectively used, while the other remaining (N-3) bits are not used for test and are usually held unchanged. Conventionally, such N-bit test patterns are prestored at successive addresses of an N-bit-word pattern memory and read out in a sequential order.

It is, however, frequent during a test that only three bits in an N-bit word are actually used, as mentioned above, so that memory cells corresponding to (N-3) bits are not utilized efficiently. Since the number of such words in the pattern memory is very large, the efficiency of its utilization is very low. Further, since logic operation is advanced by one step after each serial application of data to all of the series-connected flip-flops, the length of the entire sequence of the test patterns becomes considerably long and it becomes necessary for subsequent test patterns to be transferred from a large-capacity pattern file to the pattern memory after each completion of reading out of all the patterns from the pattern memory. With this method, however, the number of transfers is large and much time is needed for testing the whole logic circuit device.

Moreover, even apart from the LSSD techniques, it may frequently happen, in testing of logic circuit devices, that the same procedure is repeated but some parts of the data used therefor differ for each step. In such a case, it has been conventional to store all the necessary test patterns in the pattern memory. Consequently, large quantities of data of the same contents are stored in the pattern memory, resulting in an uneconomic use of memory.

SUMMARY OF THE INVENTION

An object of the present invention is to provide a pattern generator which permits a marked reduction of the overall storage capacity of a pattern memory which is used in the case of generating such patterns that differ in part from one another but remain identical in the rest, as described previously.

According to the present invention, test patterns for application to some terminal pins of a logic circuit device under test (DUT) are stored in a partial pattern memory, which is addressed by an address pointer for readout. On the other hand, test patterns each corresponding to a set of all the terminal pins of the DUT, increment command patterns for the address pointer and control patterns for controlling whether to enable the output of the partial pattern memory are stored in a main pattern memory, which is read out by an address control circuit. The control pattern for enabling the output of the partial pattern memory is ANDed therewith, and the ANDed output is ORed with the corresponding one of the outputs of the main memory read out therefrom for the test patterns applied to the respective terminal pins, thereby providing a test pattern.

For example, in the case of the test pattern for the logic circuit device utilizing the aforesaid LSSD techniques, input data for the aforementioned series-connected flip-flops and the corresponding expected value data are stored in the partial pattern memory. The partial pattern memory has a large depth in the direction of address, but words of a small number of bits can be used. The partial pattern memory is read out advancing its address by the address pointer. In the main pattern memory are stored at certain intervals such test pattern data each pattern of which includes the aforesaid two bits, which correspond to the series-connection input terminal and the series-connection output terminal of the DUT, respectively, and are each set to a "0". In addition to these two bits, this test pattern data includes a control bit which indicates that this data relates to test patterns including the aforesaid two bits. The remaining (N-3) bits of the test pattern data are usually the same. The number of addresses of the main pattern memory that are needed to be read out is smaller than the number of addresses of the partial pattern memory that are read out. In short, the contents of the same address are repeatedly read out of the main pattern memory and the outputs therefrom are respectively ORed with the outputs sequentially read out of different addresses of the partial pattern memory, thus generating new test patterns one after another.

DESCRIPTION OF THE PREFERRED EMBODIMENTS

Figure 1:
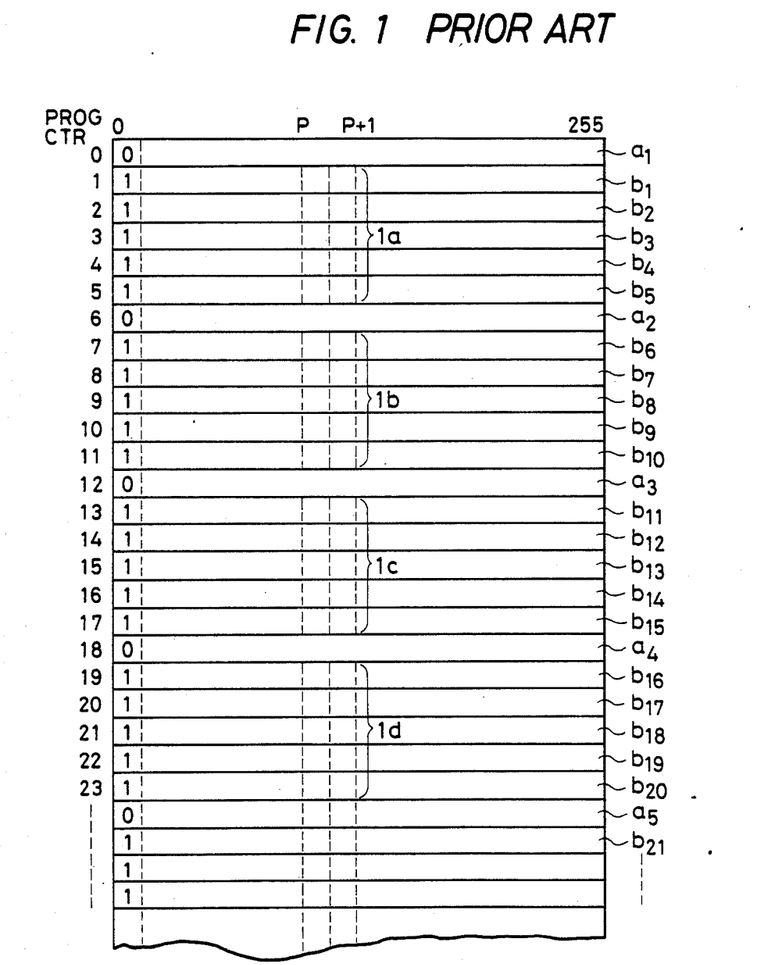
FIG. 1 is a diagram showing, by way of example, the state of storage of a pattern memory in a conventional pattern generator.

To facilitate a better understanding of the present invention, a description will be given first of a conventional pattern memory for test patterns which are used for testing a logic circuit device designed by the LSSD techniques. In this kind of test patterns which are stored in the pattern memory at addresses corresponding to respective count values of a program counter, for example, as shown in FIG. 1, when terminal pins of the logic circuit under test are 0th to 255th, one word (one pattern) is composed of $N=256$ bits. Stored at an address corresponding to a count value 0 of the program counter is a pattern $a_1$ which includes test data for application to respective input terminals of the logic circuit under test and, if necessary, expected value data for some combinatorial logic circuits internal to the logic circuit device. At an address corresponding to a count value 1 of the program counter is stored a pattern $b_1$ which includes control data for connecting flip-flops (i.e. latches) in the logic circuit device in a series relation to form a scan shift register and data for input into the series connected flip-flops. At addresses corresponding to count values 2, 3, . . . of the program counter are sequentially stored patterns $b_2$, $b_3$, . . . of data for input into the series-connected flip-flops. At an address corresponding to a count value 6 of the program counter is stored a pattern $a_2$ which includes control data for disconnecting the flip-flops from one another, test data to be applied to the input terminal pins of the logic circuit device and output expected value data to be compared with the outputs from some internal logic circuits. Following this, patterns $b_6$, $b_7$, . . . are sequentially stored which include data to be input into the series-connected flip-flops and expected value data to be compared with the current outputs obtained from the series-connected flip-flops relative to the preceding inputs. As described previously, when the flip-flops in the DUT are connected in series, the input terminal pin to which one end of the series connection is connected is a Pth bit and the output pin having connected thereto the other end is a $(P+1)$th bit. Command data for series connection of the flip-flops is a 0th bit and when this bit is a "1", the flip-flops are connected in series. Accordingly, when the 0th bit is "1" only the bits P and $P+1$ in each word of the test patterns $b_1$, $b_2$, . . . are effective data which change in accordance with test data to be eventually generated and the 0th bit is a connection command for the flip-flops. The other 253 bits are data which are ignored and usually made identical from pattern to pattern. Since the contents of bits P and $P+1$ in the patterns $b_1$, $b_2$, . . . change at random, however, they cannot be compressed in a convenient fashion.

For example, simultaneously with the inputting of the data patterns $b_6$, $b_7$, . . ., the results of logic operations performed by the internal logic circuits based on the preceding patterns $b_1$ to $b_5$ in response to the input of the pattern $a_2$, are output from the terminal pin $P+1$ one after another, and at the same time, compared with the corresponding expected value data produced at the bit $P+1$. As the logic depth of the DUT increases, the series connection of flip-flops also becomes longer, so the memory areas corresponding to the bits 1 to $(P-1)$ and $(P+2)$ to 255 in the respective patterns $b_i$, which are to be ignored during testing, increase extremely. In this respect, it cannot be said that the pattern memory is used efficiently. In addition, the length of the series connection of the flip-flops increases also and various test data must be input. This increases the entire length of a sequence of the test patterns for a complete test so much that it is difficult in the prior art to store all necessary test patterns in a test pattern memory provided in a pattern generator. It is therefore the general practice in the prior art to at one time all the test patterns in a large-capacity pattern file and to transfer therefrom the test patterns to the test pattern memory after each reading out of the entire contents of the test pattern memory. With this method, however, the transfer of the test patterns from the pattern file to the pattern memory takes much time, resulting in the testing of the DUT becoming time-consuming.

Figure 2:
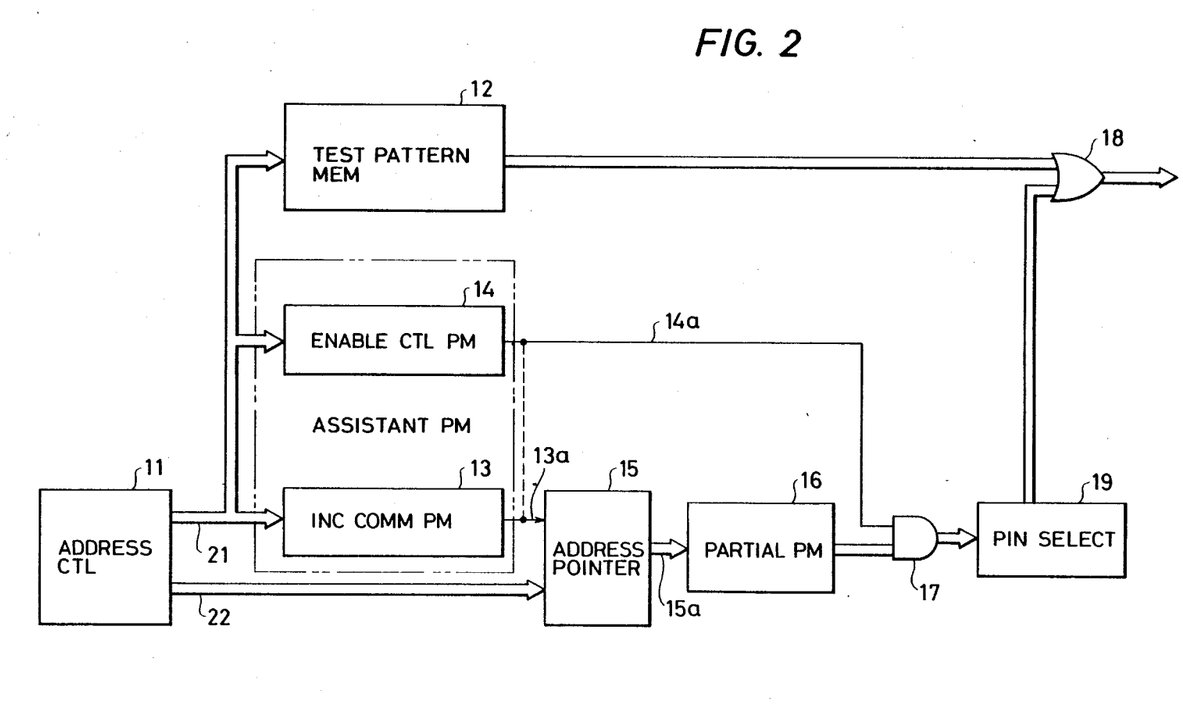
FIG. 2 is a block diagram illustrating an example of the pattern generator of the present invention.
Figure 3:
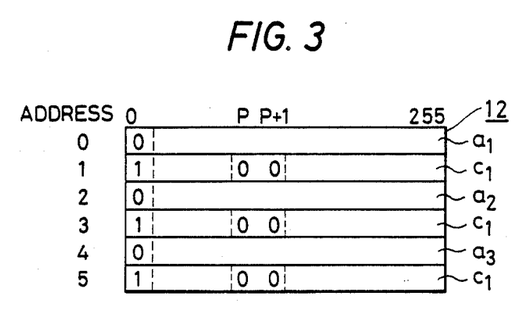
FIG. 3 is a diagram showing, by way of example, stored contents of a test pattern memory 12 in FIG. 2.

FIG. 2 illustrates an embodiment of the pattern generator of the present invention. An address control circuit 11 provides a readout address in common to a test pattern memory 12, an increment command pattern memory 13 and an output enable control pattern memory 14. At the same time, the address control circuit 11 initializes an address pointer 15. The address pointer 15 addresses a partial pattern memory 16. The test pattern memory 12 has stored therein test patterns each having a word length corresponding to all terminal pins of a DUT, as shown in FIG. 3. Accordingly, if the number N of the terminal pins of the DUT is 256, then one word is composed of 0th to 255th bits as is the case of FIG. 1, the following test pattern is stored in the pattern memory 12, in addition to the test patterns $a_1$, $a_2$, ... each of which provides effective test data to all the terminal pins. That is, in the case where there exists between the test patterns $a_1$ and $a_2$ such a pattern that only some specific bits differ from the corresponding bits of the patterns $a_1$ and $a_2$, a pattern $c_1$ is used in which only those specific bits of the test pattern, i.e. the bits P and P+1 in the example of FIG. 1, are each given a "0", the 0th bit which provides a command for the series connection of flip-flops in this example is given a "1" and the remainder is made proper data. The pattern $c_1$ is inserted between the test patterns $a_1$, $a_2$, ... alternately, and such a test pattern array is stored in the pattern memory 12.

The increment command pattern memory 13 has stored therein data which indicates whether to increment the address pointer 15, that is, data which indicates whether to increment the address of the partial pattern memory 16 for the next readout thereof. Each word is one-bit and logic "1" is stored in the case of incrementing the address.

The output enable control pattern memory 14 has stored therein at each address one-bit data which determines whether to enable the data read out of the partial pattern memory 16. The output 14a read from the memory 14 controls a gate circuit 17 to supply it with the output from the partial pattern memory 16. For enabling the output of the memory 16, logic "1" is stored in the memory 14 at the respective address.

The output of the gate circuit 17 and the output of the test pattern memory 12 corresponding thereto are ORed by an OR circuit 18. In this embodiment, the outputs of bits P and P+1 read out of the test pattern memory 12 and two bits read out of the partial pattern memory 16 are ANDed each other. In order to change, as required, the bit positions of the output bits of the test pattern memory 12 which are to be ORed, such an arrangement is made that in a pin selector 19, each output of the gate circuit 17 can be switched to any one of bits of the N-bit output of the pin selector 19.

In the case of handling such a test pattern as shown in FIG. 1, the partial pattern memory 16 stores in connection with only the patterns $b_1$, $b_2$, ... in which only some of the bits of the successive is changed from the others. In other words, the data changing portions of the patterns $b_1$ to $b_5$ between the patterns $a_1$ and $a_2$, in FIG. 1, that is, data 1a of the bits P and P+1, data 1b of only the data changing portion of the patterns $b_2$ to $b_{10}$ between the patterns $a_2$ and $a_3$ and similar data of the succeeding patterns are stored in the one-word-two-bit partial pattern memory 16, as depicted in FIG. 4.

Figure 4:
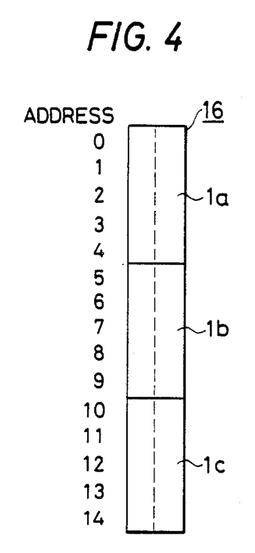
FIG. 4 is a diagram showing, by way of example, stored contents of a partial pattern memory 16 in FIG. 2.
Figure 5:
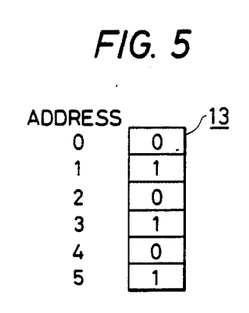
FIG. 5 is a diagram showing, by way of example, stored contents of an increment command pattern memory 13 in FIG. 2.
Figure 6:
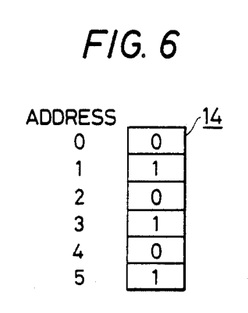
FIG. 6 is a diagram showing, by way of example, the state of storage of a control pattern memory 14 in FIG. 2.

As will be seen from FIGS. 3 and 4, the address of the pattern memory 12 is not updated until the patterns $a_1$ to $a_5$ in FIG. 1 have been read out, that is, until the test pattern $c_1$ having the bits P and P+1 set to "0s" has been repeatedly read out five times in this example, and it is necessary only to update or increment the address of the partial pattern memory 16 sequentially during the period of time. Accordingly, in the increment command pattern 13 are stored a "1" at each of addresses 1, 3, 5, ... where the pattern $c_1$ read out of the test pattern memory 12 is stored and a "0" at each of the other addresses 0, 2, 4, ..., as illustrated in FIG. 5. While the pattern $c_1$ is read out, the output of the test pattern memory 12 and the output of the partial pattern memory 16 are ORed with each other. Consequently, the stored contents of the enable control pattern memory 14 are such as shown in FIG. 6 in which a "1" is stored at each of addresses 1, 3, 5, ... where the pattern $c_1$ is stored and a "0" is stored at each of the other addresses.

Figure 7:
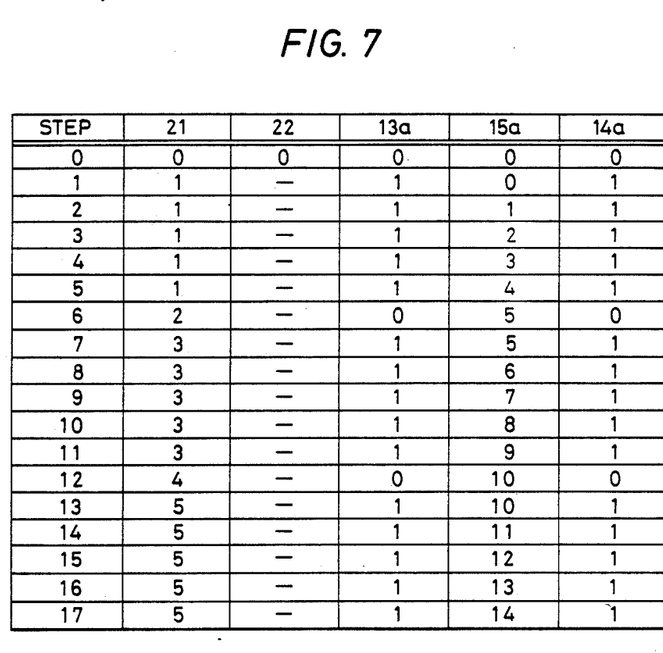
FIG. 7 is a diagram showing variations of outputs at respective parts during operation of the pattern generator depicted in FIG. 2.

As the step in the address control circuit 11 advances from 0 to 1, 2, 3, ... in a sequential order, the address 21 of a program counter for reading out the memories 12 to 14 advances from 0 to 1, 1, 1, 1, 1, 2, 3, 3, ..., as shown in FIG. 7. In this example, in step 0 the address control circuit 11 sets a 0 in the address pointer 15 to set it to 0, as shown. The address 21 of the program counter is initially set to a 0, as mentioned above, and a "0" is produced as each of the outputs 13a and 14a of the memories 13 and 14, and further, a "0" is produced as the output 15a of the address pointer 15 by the initialization.

When the address 21 goes to a "1" in step 1, the increment command pattern memory 13 yields a "1", and when the process proceeds to the next step, the address pointer 115 is incremented. In this case, the output 14a of the enable control pattern memory 14 is a "1", and at this time, the output of the partial pattern memory 16 read out of an address specified by the address pointer 15 is provided via the gate circuit 17 to the OR circuit 18, wherein it is ORed with each of the bits P and P+1 of the test pattern $c_1$ read out of the test pattern memory 12, thus producing the test pattern $b_1$.

In step 2, since the increment command previously issued from the increment command pattern memory 13 is a "1", the address pointer 15 is incremented by one and its output 15a goes to a "1". As a result, an address 1 of the partial pattern memory 16 is read out, and at this time, the output 14a of the enable control pattern memory 14 is a "1" and the output of the partial pattern memory 16 is ORed with the output of the test pattern memory 12, outputting the test pattern $b_2$. Until step 5 the address 21 remains at "1" and similar operations are repeated. As the process advances step by step in this while, the output 15a of the address pointer 15 is incremented one by one.

In step 6 the address 21 goes to a "2", and the memories 12, 13 and 14 output the pattern $a_2$, an increment command pattern "0" and an output enable control pattern "0", respectively. Since the increment command in the preceding step 5 was a "1", however, the output 15a of the address pointer 15 has been incremented to a "5". Since the output enable control pattern output 14a is a "0", the output of the gate circuit 17 goes to a "0", and in the test pattern memory 12 an address 2 is specified, from which the pattern $a_2$ is read out and output as a test pattern. In step 7 the address 21 goes to a "3" and the pattern $c_1$ is read out. At this time, since the increment command pattern output 13a was a "0" in the preceding step, the output 15a of the address pointer 15 holds the previous value "5" and the partial pattern memory 16 is read out at the address being specified by the address pointer 15. At this time, the output enable control pattern output 14a is a "1" and it is provided via the gate circuit 17 to the OR circuit 18, wherein it is ORed with the pattern $c_1$ read out of the test pattern memory 12, and the ORed output is provided as the test pattern $b_6$. In the succeeding steps similar operations are carried out.

The address control circuit 11 in FIG. 2 may be, for instance, such as described in U.S. Pat. No. 4,313,200

Figure 8:
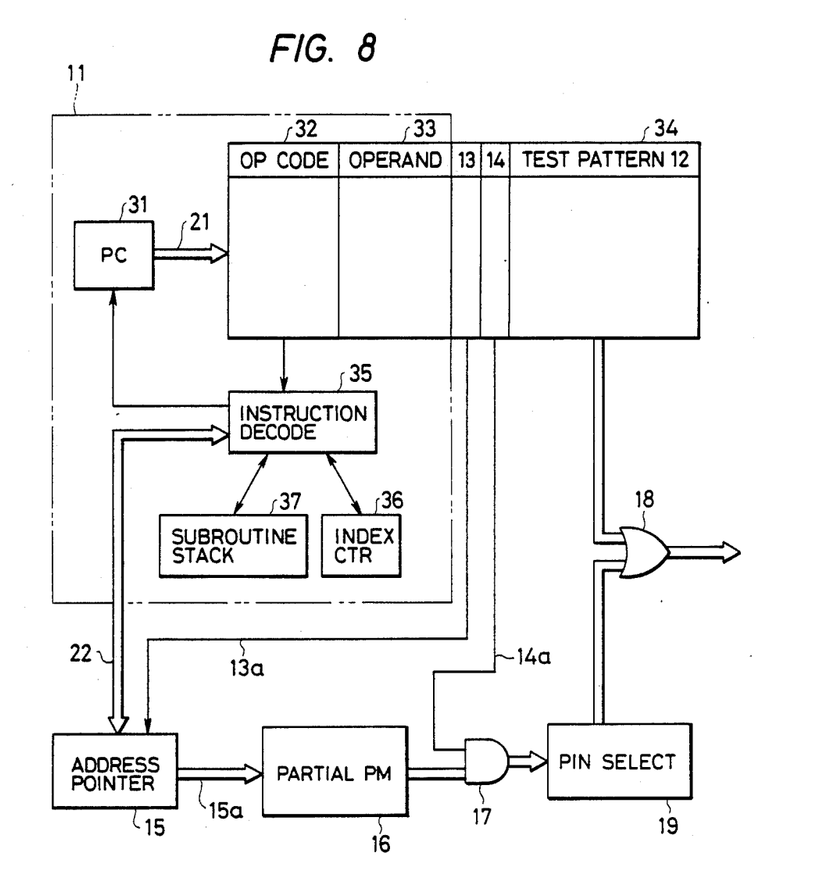
FIG. 8 is a diagram illustrating an embodiment of the present invention shown in FIG. 2 where a specific example of an address control circuit 11 is employed.

(issued on Jan. 20, 1982); that is, it is formed as a microprogram control system, as depicted in FIG. 8. The count value of a program counter 31 is output as the address 21 from the address control circuit 11, and by this address 21, an operation code part 32 and an operand part 33 are read out in addition to the contents of the memories 12, 13 and 14. In this example, the memories 12, 13 and 14, the operation code part 32 and the operand part 33 make up together a main pattern memory 34. An instruction read out of the operation code part 32 is decoded in an instruction decoder 35, performing address control in accordance with the contents of the instruction. Connected to the instruction decoder 35 are an index counter 36 and a subroutine stack 37.

Instructions loaded in the operation code part 32 are a no operation instruction NOP for simply incrementing the program counter 31 by one, a loop instruction, a subroutine execute instruction JSR and a return instruction RTN. The loop instruction is to inhibit the increment of the program counter 31 the number of times of clocks equal to a value loaded in the operand part 33. That is, when this instruction is read out of the operation code part 32 and judged to be the loop instruction in the instruction decoder 35, the value of an operand simultaneously read out of the operand part 33 is loaded into the index counter 36, and for each step (clock), the content of the index counter 36 is decremented while the increment of the program counter is stopped. When the index counter 36 has been decremented to zero, the program counter 31 is incremented by one. In the example of FIG. 7 described previously, at the address from which the pattern $c_1$ (FIG. 3) is read out, the loop instruction is read out of the operation code part 32, and at the same time, the value indicating the number of looping operations, 5, is read out of the operand part 33. Accordingly, the program counter 31 is held at the same address 21 in the course of five steps, after which the address 21 of the program counter 31 advances by one. In this manner, the aforesaid operation is carried out.

The subroutine execute instruction JSR is to advance the execution to an address which is read out of the operand part 33 at the same time as the instruction JSR and to advance the program counter 31 by one upon completion of the execution. In other words, when it is judged in the instruction decode part 35 that the read-out instruction is the subroutine execute instruction JSR, the value of the content of the program counter 31 at that time, incremented by one, is loaded into the subroutine stack 37, after which a value read out of the operand part 33 at the same time is preset in the program counter 31 and then the subroutine is executed. At the end of the subroutine, the operation code part 32 has loaded therein the return instruction RTN, and when the instruction RTN is read out, the instruction decode part 35 sets in the program counter 31 the value loaded in the subroutine stack 37.

Figure 9:
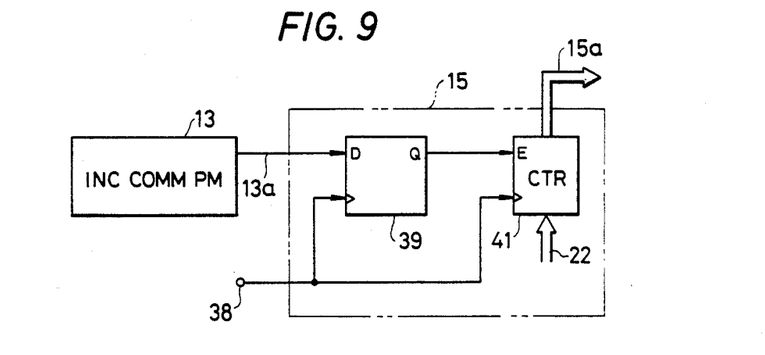
FIG. 9 is a diagram illustrating a specific example of an address pointer 15 in FIG. 2.

In the address pointer 15 in FIG. 2, for example, as shown in FIG. 9, the output 13a of the increment command pattern memory 13 is read into a D flip-flop 39 by a clock which is applied from a terminal 38 for each step, and the output of the flip-flop 39 is supplied to an enable terminal E of a counter 41. When a "1" is being applied to the enable terminal E of the counter 41, the counter 41 advances by one for each application of the clock from the terminal 38. When a "0" is being applied to the terminal E, even if the clock is provided from the terminal 38, the counter 41 does not advance. The count value of the counter 41 is provided as the output 15a of the address pointer 15. The counter 41 is presettable and, it can be set to an initial value via the line 22 from the address control circuit 11, as described previously in respect of FIG. 2.

Figure 10:
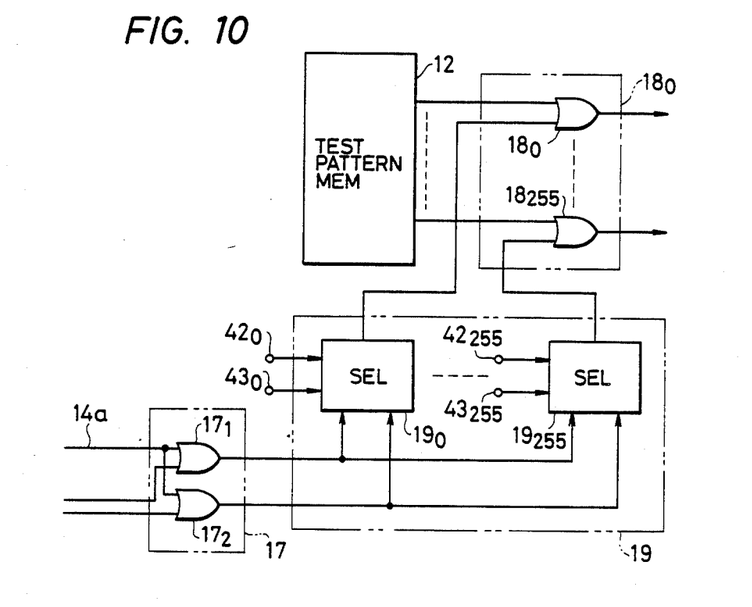
FIG. 10 is a diagram illustrating a specific example of a pin selector 19 in FIG. 2.

The pin selector 19 in FIG. 2 is formed, for example, as illustrated in FIG. 10. The gate circuit 17 is to yield two bits in this example, and it is made up of gate circuits $17_1$ and $17_2$, the outputs of which are connected to selectors $19_0$ to $19_{255}$ of the pin selector 19. The selectors $19_0$ to $19_{255}$ respectively have inhibit terminals $42_0$ to $42_{255}$ and select terminals $43_0$ to $43_{255}$. When an inhibit command is being applied to the inhibit terminal, each selector does not yield an output, but when no inhibit command is applied to the inhibit terminal, it selectively passes therethrough one of the outputs of the gate circuits $17_1$ and $17_2$ in accordance with a select command supplied to the select terminal. The outputs of the selectors $19_0$ to $19_{255}$ are each provided to the one input of each of OR circuits $18_0$ to $18_{255}$ of the OR circuit 18, and the other inputs of the OR circuits $18_0$ to $18_{255}$ are respectively supplied with bits 0 to 255 read out of the test pattern memory 12. Accordingly, by selecting the commands which are provided to the inhibit terminals $42_0$ to $42_{255}$ and the select terminals $43_0$ to $43_{255}$ of the pin selector 19, the output of the gate circuit $17_1$ can be supplied to any of the OR circuits $18_0$ to $18_{255}$ and, similarly, the output of the gate circuit $17_2$ can also be applied to any of the OR circuits $18_0$ to $18_{255}$.

As described previously, the output 13a of the increment command pattern memory 13 is to determine whether or not to increment the address pointer 15 and the output 14a of the enable control pattern memory 14 is to determine whether or not to enable data read out of the partial pattern memory 14, so they differ in function. In the above example, however, as is evident from FIGS. 5, 6 and 7, the stored contents of the increment command pattern memory 13 and the stored contents of the enable control pattern memory 14 are exactly the same. Therefore, it is also possible to interconnect the output sides of these memories 13 and 14 and to omit one of them. Moreover, in the case of testing a logic circuit device by means of LSSD techniques, the test pattern memory 12 stores test patterns each including a control data bit (e.g. 0th bit in FIG. 3) and a sequence of the command data bits exactly correspond to either of the sequence of enable control patterns and the sequence of increment command patterns. Therefore, it is also possible to omit both the increment command pattern memory 13 and the enable control pattern memory 14, and to arrange such that the 0th bit output of the test pattern memory 12 is used as the enable control patterns 14a and also as the increment command patterns 13a, that is, the 0th bit output of the memory 12 is connected to the gate circuit 17 and the address pointer 15. The increment command pattern memory 13 and the enable control pattern memory 14 are generically called an auxiliary pattern memory and the patterns stored in them are called auxiliary patterns.

According to the embodiment described with reference to FIGS. 2 to 6, there are simply provided, in association with the test pattern memory 12, the increment command pattern memory 13 and the enable control pattern memory 14 which are one-bit-word memories accessable with the address 21 common to the test pattern memory 12, so these memories 12, 13 and 14 can be constituted as one memory. That is to say, by using such a memory in which one word is composed of bits whose number is larger than that of the terminal pins of the DUT by two or more and by storing a sequence of the enable control patterns and a sequence of the increment command patterns in the corresponding two bit positions at successive addresses, the memories 12, 13 and 14 can be formed as one memory. As explained before, each sequence of those test patterns in which only the corresponding two bits (Pth and P+1th bits) vary from one pattern to another, is substituted with a single pattern $c_1$ and a sequence of these two-bit patterns are stored in the partial pattern memory 16. Since the partial pattern memory 16 may be a two-bit word memory in this example, even if its depth is great in an address direction, a small storage capacity is enough as a whole. Thus, there may be only very few memory cells (i.e. bits) in total which do not serve to generate successive test patterns and the entire area of the memory 12 can be utilized effectively to store data for generation of a long sequence of test patterns, enabling the test pattern data necessary for a complete test to be transferred from a pattern file to the memory 12 through one continuous transfer operation. This eliminates the necessity of repeating a split transfer of the pattern data after each sectional testing, ensuring to reduce the testing time by that. Moreover, even if the pattern data cannot be transferred through one continuous operation, since the number of split transfers is smaller than is required in the prior art, the testing time can be reduced.

Figure 11:
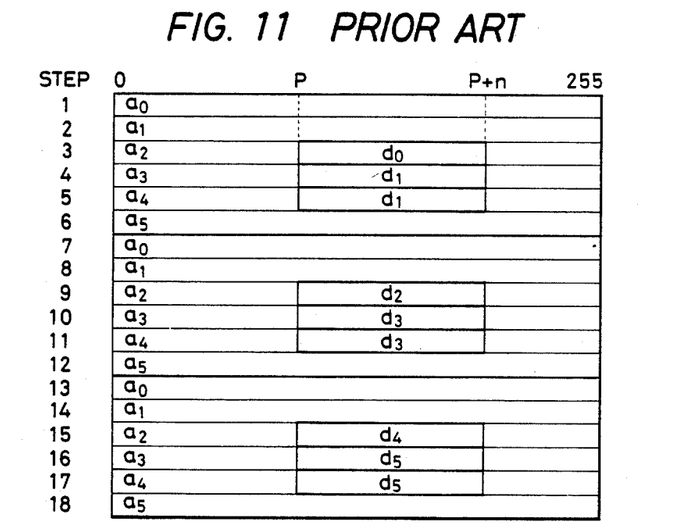
FIG. 11 is a diagram showing, by way of example, stored contents of a conventional test pattern memory in the case of repeating the same procedure.

The present invention is applicable not only to the case of generating test patterns for the logic circuit devices using the LSSD techniques, as described previously, but also to the case where the same sequence of steps for generating test patterns is repeated but data of only some corresponding bits in the corresponding patterns in the respective sequences are modified as shown in FIG. 11, for instance. In FIG. 11, one process, i.e. a test is made using a sequence of test patterns $a_0$ to $a_5$, but data of the corresponding Pth to P+nth bits in the corresponding test patterns $a_2$, $a_3$ and $a_4$ are modified for the respective tests. That is, in the first test, data of the Pth to P+nth bits in the patterns $a_2$, $a_3$ and $a_4$ are $d_0$, $d_1$ and $d_1$, respectively, and in the next test, they change to $d_2$, $d_3$ and $d_3$, respectively, but data of the other bits in the corresponding patterns remain unchanged throughout the successive tests. Also in such a case, according to the prior art, the test pattern is stored in the test pattern memory for each step, as shown in FIG. 11. Accordingly, a number of similar test patterns are stored in the test pattern memory.

Figure 12:
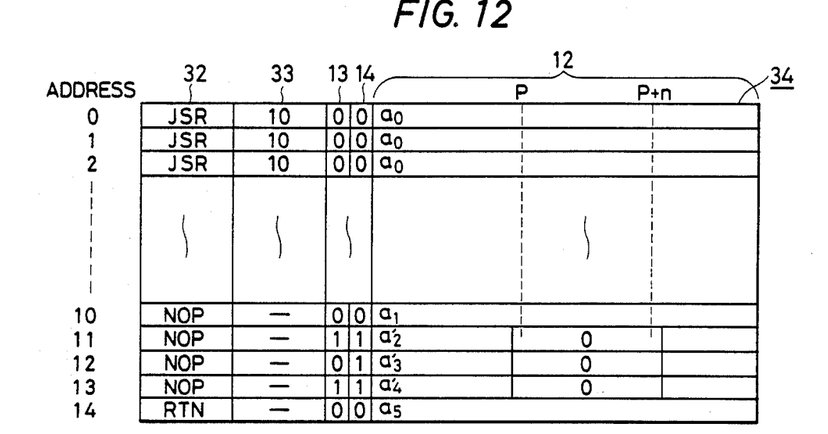
FIG. 12 is a diagram showing, by way of example, stored contents of a main pattern memory 34 in the case of the present invention being applied to the case of FIG. 11.

Now a description will be given of the application of the present invention to this example. As shown in FIG. 12, at addresses 0, 1, 2, ... of the main pattern memory 34 are respectively stored the test pattern $a_0$ in the test pattern memory 12, a "0" in the increment command pattern memory 13, a "0" in the enable control pattern memory 14, the subroutine execute instruction JSR in the operation code part 32 and an address of the subroutine, "10" in this example, in the operand part 33. At subroutine addresses 10, 11, 12, 13 and 14 are respectively stored test patterns $a_1$, $a_2'$, $a_3'$, $a_4'$ and $a_5$ in the test pattern memory 12, "0", "1", "0", "1" and "0" in the increment command pattern memory 13, "0", "1", "1", "1" and "0" in the enable control pattern memory 14 and NOP, NOP, NOP, NOP and RTN in the operation code part 32. In this case, let it be assumed that in the test patterns $a_2'$, $a_3'$ and $a_4'$, the P to P+nth bits of the test patterns $a_2$, $a_3$ and $a_4$ are all "0s".

Figures 13, 14:
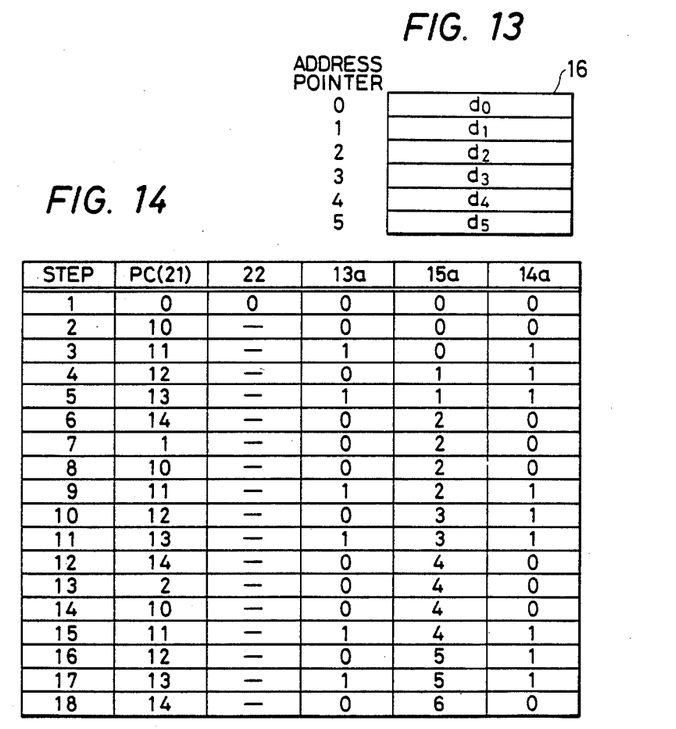
FIG. 13 is a diagram showing, by way of example, stored contents of a partial pattern memory 16 in the case of FIG. 12.
FIG. 14 is a diagram showing output variations at respective parts of the pattern generator of the present invention during its operation.

In the partial pattern memory 16, data $d_0$, $d_1$, $d_2$, $d_3$, ... are stored at its addresses 0, 1, 2, ..., respectively, as shown in FIG. 13. With the data thus stored, the pattern generator operates for each step, as depicted in FIG. 14. In step 1 the address 21 of the program counter 31 is a "0", the output of each of the memories 13 and 14 is a "0" and the output $a_0$ of the test pattern memory 12 is provided as a test pattern. In response to the subroutine execute instruction JSR read out from the operation code area 32, a value "1" obtained by adding "1" to the current content of the program counter 31, is loaded into the subroutine stack 37 and then, the operand 10 read out from the operand area 33 at that time is set in the program counter 31. In step 2 the contents at the address "10" designated by the program counter 31 are read out to initiate the subroutine. Since the output read out of the memory 14 at this time is a "0", the output $a_1$ of the test pattern memory 12 is provided as a test pattern. Then, the NOP instruction advances the counter 31 by one address. Consequently, in step 3, the stored contents of the address "11" are read out, and since the output of the memory 14 is a "1" at this time, the output $a_2'$ of the test pattern memory 12 is ORed with the data $d_0$ read out of the partial pattern memory 16 at the address 0, outputting the test pattern $a_2$. Then, the program counter 31 is incremented by the NOP instruction, and at the same time the address pointer 15 is incremented by the output "1" from the memory 13. In step 4 the address "12" of the main pattern memory 34 is read out. At this time, since the output of the memory 14 is a "1", the test pattern $a_3'$ and the output $d_1$ of the partial pattern memory 16 are ORed with each other to provide the test pattern $a_3$. Then, the program counter 31 is incremented by the NOP instruction, but since the output of the memory 13 is "0", the address pointer is not incremented and its content remains "1". In step 5 the address "13" of the main pattern memory 34 is read out. In this step, since the output of the memory 14 is a "1", the output $a_4'$ of the memory 12 is ORed with the output $d_1$ from the same address of the memory 16 as that read out in the previous step, providing the test pattern $a_4$. Then, the counter 31 is advanced to the address "14" by the NOP operation and at the same time the address pointer 15 is incremented to "2" by the output "1" of the memory 13. In step 6 the address 14 of the main pattern memory 34 is read out. Since the output of the memory 14 is "0", the output $a_5$ from the memory 12 is output as the test pattern $a_5$. Further, since the output of the operation code part 32 is the return instruction RTN, the value 1 which has been held in the subroutine stack 37 is set in the program counter 31. Consequently, in step 7 the address 1 of the main pattern memory 34 is read out and the test pattern $a_0$ is output in the same manner as in step 0, after which the process proceeds to the subroutine, repeating the same operations as described above.

In FIG. 11, addresses of the test pattern memory 12 are assigned to all of the test patterns to be generated, but in the examples of FIGS. 12 and 13, it is necessary only to assign five addresses to the subroutine and to store the data $d_0$, $d_1$, $d_2$, ... in the (n+1) bit-word partial pattern memory 16, and consequently, the storage capacity required is extremely reduced. In the example of FIG. 11, each of the data $d_1$, $d_3$, $d_5$ ... is repeated in the successive test patterns $a_3$ and $a_4$ in the respective sequences $a_0$ to $a_5$; this is because the same data has to be applied during two cycles (usually a plurality of cycles) in the test of a microcomputer, for example.

As described above, according to the present invention, in the case of generating such a sequence of test patterns for a logic circuit device in which sequence only some bit data in the patterns corresponding to some terminal pins of the logic circuit device change but bit data corresponding to the other terminal pins are repetitions of the same data, the changing bit data in the patterns are stored in a partial pattern memory and bits of the corresponding patterns in a pattern memory are each set to a "0", by which the repetitive patterns of exactly the same test pattern are produced at those portions. This enables compression of the repetitive patterns, and hence permits an extremely effective use of the pattern memory and the generation of a long sequence of test patterns with a small storage capacity. Accordingly, even if the sequence of test patterns is very long, the number of its split transfers from the pattern file to the test pattern memory can be decreased smaller than has been needed in the past, reducing the entire time for testing.

It will be apparent that many modifications and variations may be effected without departing from the scope of the novel concepts of the present invention.

What is claimed is:

1. A pattern generator, comprising:
   main pattern memory means for storing patterns, said pattern memory means including:
      a test pattern memory part storing a sequence of test patterns each having the same number of bits respectively corresponding to terminal pins of a logic circuit device under test; and
      an auxiliary pattern memory part storing a sequence of auxiliary patterns;
   address control means, operatively connected to said main pattern memory means, for generating, in synchronism with a clock signal, readout addresses for simultaneously reading out the test patterns and the auxiliary patterns from said test pattern memory part and said auxiliary pattern memory part;
   a partial pattern memory for storing a sequence of bit data corresponding to some of the terminal pins of said logic circuit device under test;
   an address pointer, operatively connected between said auxiliary pattern memory part and said partial pattern memory, for receiving the auxiliary pattern read out of said auxiliary pattern memory part and generating a readout address for said partial pattern memory to read one bit of the auxiliary pattern, said address pointer being incremented by the clock signal during an auxiliary pattern;
   a gate circuit, operatively connected to said partial pattern memory and said auxiliary pattern memory part, and controlled by the auxiliary pattern read out of said auxiliary pattern memory, said gate circuit permitting or inhibiting the passage therethrough of the output of said partial pattern memory; and
   OR circuit means, operatively connected to said gate circuit and said test pattern memory, for ORing the output of said gate circuit with the corresponding bits of the test pattern read out of said test pattern memory part and providing the ORed output as a test pattern.

2. A pattern generator according to claim 1 wherein:
   said address control means increments the readout address for said main pattern memory means upon each reception of a clock signal supplied thereto and, when the readout address reaches a predetermined address, said address control means inhibits the incrementing of the address for a predetermined number of the clock signals; and
   said auxiliary pattern memory stores, at the readout predetermined address for said main pattern memory means where the incrementing of the address is inhibited, data for instructing said address pointer to increment and for correspondingly enabling said gate circuit.

3. A pattern generator according to claim 1 wherein:
   said address control means increments the readout address for said main pattern memory means upon each reception of the clock signal supplied thereto and, when the readout address reaches a predetermined address, said address control means jumps to a beginning address of a subroutine in said main pattern memory means to execute the subroutine; and
   said auxiliary pattern memory stores, at at least one address in the subroutine, data for instructing said address pointer to increment and for enabling said gate circuit.

4. A pattern generator according to claim 2 or 3 wherein:
   said address control means operates under microprogram control and comprises a program counter for generating the readout address for said main pattern memory means, an index counter and an instruction decoder;
   said main pattern memory means includes a subroutine stack, an operation code part and an operand part;
   the operation code part stores a sequence of at least one of a no-operation instruction for incrementing the program counter by one, a loop instruction, a subroutine execute instruction and a return instruction;
   said operand part stores the number of the clock signals for which the incrementing of said program counter is inhibited at the time of executing the loop instruction and a subroutine starting address at the time of executing the subroutine execute instruction; and
   the instructions read out of the operation code part are decoded by said instruction decoder and respective operations of incrementing said program counter, setting the number of said clock signals for the respective inhibiting in said index counter, loading the contents of said program counter into the subroutine stack and setting the subroutine starting address in said program counter are carried out in accordance with the corresponding instructions.

5. A pattern generator according to claim 1, wherein said auxiliary pattern memory includes an increment command pattern memory part and an enable control pattern memory part, said increment command pattern memory part having stored therein a sequence of increment command patterns for instructing said address pointer to increment and said enable control pattern part having stored therein a sequence of enable control patterns for controlling said gate circuit to correspondingly enable and disable passage through said gate circuit.

6. A pattern generator according to claim 1 or 4, wherein:
- said address control means operates under microprogram control and comprises a program counter for generating the readout address for said main pattern memory means, an index counter and an instruction decoder;
- said main pattern memory means includes a subroutine stack, an operation code part and an operand part;
- said operation code part stores a sequence of at least one of a no-operation instruction for incrementing the program counter by one, a loop instruction, a subroutine execute instruction and a return instruction;
- said operand part stores the number of said clock signals for which the incrementing of said program counter is inhibited at the time of executing the loop instruction and a subroutine starting address at the time of executing the subroutine execute instruction; and
- the instructions read out of the operation code part are decoded by said instruction decoder and respective operation of incrementing said program counter, setting the number of said clocks for the respective inhibiting in said index counter, loading the contents of said program counter into said subroutine stack and setting the subroutine starting address in said program counter are carried out in accordance with the corresponding instructions.

7. A pattern generator according to any one of claims 1 to 5 further comprising a pin selector provided between the output of said gate circuit and said OR circuit, and said pin selector changes the bit position to be ORed in the test pattern in connection with each bit of the output from said gate circuit.

8. A pattern generator according to claim 1, wherein said test pattern memory part includes at least one control bit position in each test pattern for controlling the test state of said logic circuit device under test and the control bit position is common with said auxiliary pattern memory part.

* * * * *

UNITED STATES PATENT AND TRADEMARK OFFICE
CERTIFICATE OF CORRECTION

PATENT NO. : 4,670,879

DATED : June 2, 1987

INVENTOR(S) : Noboru Okino

It is certified that error appears in the above-identified patent and that said Letters Patent is hereby corrected as shown below:

```
Column 4, line 52, change "at one time" to --initially
    store--.

Column 5, line 40, change "ANDed" to --ORed with--;
        line 49, after "successive" insert --data--;
        line 63, change "the" (second occurrence) to
    --this--.

Column 6, line 23, change "115" to --15--.

Column 13, line 1, change "4" to --5--.
```

Signed and Sealed this

First Day of December, 1987

Attest:

DONALD J. QUIGG

*Attesting Officer*   *Commissioner of Patents and Trademarks*